United States Patent
Brainard

(10) Patent No.: US 10,587,278 B2
(45) Date of Patent: Mar. 10, 2020

(54) SENSOR TO ENCODER SIGNAL CONVERTER

(71) Applicant: F. S. Brainard & Company, Burlington, NJ (US)

(72) Inventor: Bradford Brainard, Hinesburg, VT (US)

(73) Assignee: F.S. Brainard & Company, Burlington, NJ (US)

(*) Notice: Subject to any disclaimer, the term of this patent is extended or adjusted under 35 U.S.C. 154(b) by 0 days.

(21) Appl. No.: 16/280,454

(22) Filed: Feb. 20, 2019

(65) Prior Publication Data
US 2019/0260383 A1   Aug. 22, 2019

Related U.S. Application Data

(60) Provisional application No. 62/633,025, filed on Feb. 20, 2018.

(51) Int. Cl.
*H03M 1/06* (2006.01)
*H03M 13/03* (2006.01)

(52) U.S. Cl.
CPC ....... *H03M 1/0687* (2013.01); *H03M 1/0626* (2013.01); *H03M 13/03* (2013.01)

(58) Field of Classification Search
CPC ... H03M 1/0687; H03M 13/03; H03M 1/0626
USPC ........................................ 341/143, 155, 144
See application file for complete search history.

(56) References Cited

U.S. PATENT DOCUMENTS

| | | | |
|---|---|---|---|
| 6,407,442 B2 | 6/2002 | Inoue | |
| 6,424,270 B1 | 7/2002 | Mohammed | |
| 9,770,639 B2 * | 9/2017 | Blanc | A63B 69/3641 |
| 10,057,517 B2 * | 8/2018 | Kim | H04N 5/3575 |
| 10,057,527 B2 * | 8/2018 | Yun | H04N 5/37455 |
| 10,321,082 B2 * | 6/2019 | Murata | H04N 5/378 |

OTHER PUBLICATIONS

Mulligan, "Office Action", regarding Canadian Application No. 3,034,407, dated May 10, 2019.

* cited by examiner

*Primary Examiner* — Brian K Young
(74) *Attorney, Agent, or Firm* — Justin W. McCabe; Shawn Gordon; Dunkiel Saunders Elliott Raubvogel & Hand, PLLC

(57) ABSTRACT

An analog or digital to encoder signal converter is provided that includes a current sense circuit, if an analog input, configured to receive an analog signal from a sensor and convert the signal into a digital signal via an analog-to-digital converter. The digital signal is processed to generate an appropriate reading value and an encoder string is made that represents the desired value for data transmission, wherein the string is formatted for a selected, specific encoder reader protocol. In this way, existing data collection systems that require a specific encoder protocol for data transmissions can be expanded to collect data from any sensing device with an analog or digital output, thereby adding value to existing encoder data collection systems by enabling them to collect data from devices other than just the customer billing meters for which the encoder protocol networks were designed.

20 Claims, 5 Drawing Sheets

SENSOR TO ENCODER SIGNAL CONVERTER

RELATED APPLICATION DATA

This application claims the benefit of U.S. Provisional Application No. 62/633,025, titled "Analog to Encoder Signal Converter" and filed on Feb. 20, 2018, which is incorporated herein in its entirety.

FIELD OF THE INVENTION

The present invention generally relates to signal converters. In particular, the present invention is directed to a Sensor to Encoder Signal Converter.

BACKGROUND

Utility industries (such as gas, electric and water) or other providers of similar types of commodities typically require a system to monitor consumption of the commodity, e.g., a flowmeter to measure the volume of water used by a particular customer, so that the utility can bill that customer for the consumption. Such meters or the like generally include a sensor or other form of measurement that detects, for example, the volume of the commodity used over a given period of time and converts that value into a format compatible with an available data collection system. Toward this end, it has often been necessary to provide a particular meter encoder output format in order to be compatible with the existing utility data collection system. This requirement for a specific meter encoder output format limits a utility's ability to collect data through its existing data collection network from other devices, such as sewer meters and pressure sensors, which typically provide an analog or digital output but not an encoder formatted output.

SUMMARY OF THE DISCLOSURE

A sensor to encoder signal converter is provided that includes a current sense circuit configured to receive a signal from a sensor and a microcontroller configured to receive the signal and including instructions for transforming the signal into a sensor reading value, creating a string representing the value, wherein the string is formatted for a selected encoder reader protocol, storing the string, and transmitting the string to an encoder reader when an initialization signal is received from the encoder reader. An encoder modulation circuit is selectively configured to interface with the encoder reader.

Additionally or alternatively, the signal is a digital signal.

Additionally or alternatively, the signal converter includes a plurality of encoder reader connections and a plurality of sensor connections.

Additionally or alternatively, the signal converter includes a power source designed to power the sensor, wherein the power source is switchable by a user.

Additionally or alternatively, the signal is an analog signal, and the current sense circuit converts the analog signal into a digital signal.

Additionally or alternatively, the current sense circuit includes a low impedance resistor, a low pass RC circuit, and an operational amplifier.

Additionally or alternatively, the signal converter includes a plurality of daughter microcontrollers, wherein a one of the plurality of daughter microcontrollers is selected based on the selected encoder reader protocol and stores the string and receives the initialization signal from the encoder reader.

In another embodiment, a method for converting an input signal into an encoder output is provided that includes selecting an encoder interface protocol, receiving a signal from a sensor, the signal representing a parameter of a commodity measured by the sensor, transforming the signal into a sensor reading value, generating a string representing the value, wherein the string is formatted for the selected encoder reader protocol, receiving an initialization signal from an encoder reader, and transmitting the string to the encoder reader.

Additionally or alternatively, the signal is an analog signal and further including passing the analog signal through a low impedance resistor.

Additionally or alternatively, the method of converting an input signal includes returning a portion of the signal to the sensor via a digital ground connection after passing the analog signal through a low impedance resistor.

Additionally or alternatively, the method of converting an input signal includes filtering the signal with a low pass RC circuit after the signal passes through the resistor.

Additionally or alternatively, the method of converting an input signal includes passing the signal through an operational amplifier.

Additionally or alternatively, in the method of converting an input signal, the sensor reading value is a volume.

Additionally or alternatively, the method of converting an input signal includes powering the sensor.

In another embodiment, a system for converting a signal to an encoder output is provided that includes a sensor, the sensor producing a signal representing a parameter of a commodity, an encoder reader, and a converter enclosure. The enclosure includes a microcontroller configured to receive the signal and including instructions for transforming the signal into a sensor reading value, generating a string representing the value, wherein the string is formatted for a selected encoder reader protocol, storing the string, and transmitting the string to an encoder reader when an initialization signal is received from the encoder reader. An encoder modulation circuit configured to interface between the encoder reader and the microcontroller is also included.

Additionally or alternatively, the enclosure further includes a plurality of encoder reader connections and a plurality of sensor connections.

Additionally or alternatively, the enclosure further includes a power source designed to power the sensor, wherein the power source is switchable by a user.

Additionally or alternatively, the sensor is a flowmeter with a 4-20 ma output.

Additionally or alternatively, the sensor is a pressure sensor.

Additionally or alternatively, the signal is an analog signal, and the enclosure further includes a current sense circuit that converts the analog signal into a digital signal.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DESCRIPTION OF THE DISCLOSURE

A converter according to the present disclosure converts analog or digital inputs into encoder formatted data outputs for collection through utility meter reading systems. This conversion enables flowmeters and other sensor devices (e.g., pressure and chemical content sensors) with analog and/or digital outputs to send data from field sites to handheld, drive by, or fixed network data collection systems that require specific encoder formatted data values for transmission through such data collection systems. Examples of such encoder formatted data collection systems are those that use the Sensus, Neptune, Elster, and other such encoder protocols.

In an exemplary converter, an analog or digital input from a sensor, such as a utility sewer flowmeter or a pressure sensor, is converted to a specific encoder output format for collection via a given network designed to collect the same type of encoder formatted readings. The converter can be configured to convert the analog or digital input into a number of different encoder output formats so that the output can be collected by whichever encoder reader protocol format is used by the applicable encoder data collection system. In this way, the process of collecting data can be expanded by enabling existing data collection networks that require specific encoder communications protocols to collect data from sensors and meters that do not offer an output option in such specific encoder communication protocols, thus enabling data to be collected from various instruments that were not originally designed for use with such encoder data collection networks.

In operation, a user can select one of the encoder output formats based on the encoder reader protocol used in the data collection network that the converter system will interface with. The below discussion applies to any of the possible encoder output format types.

Figure 1:
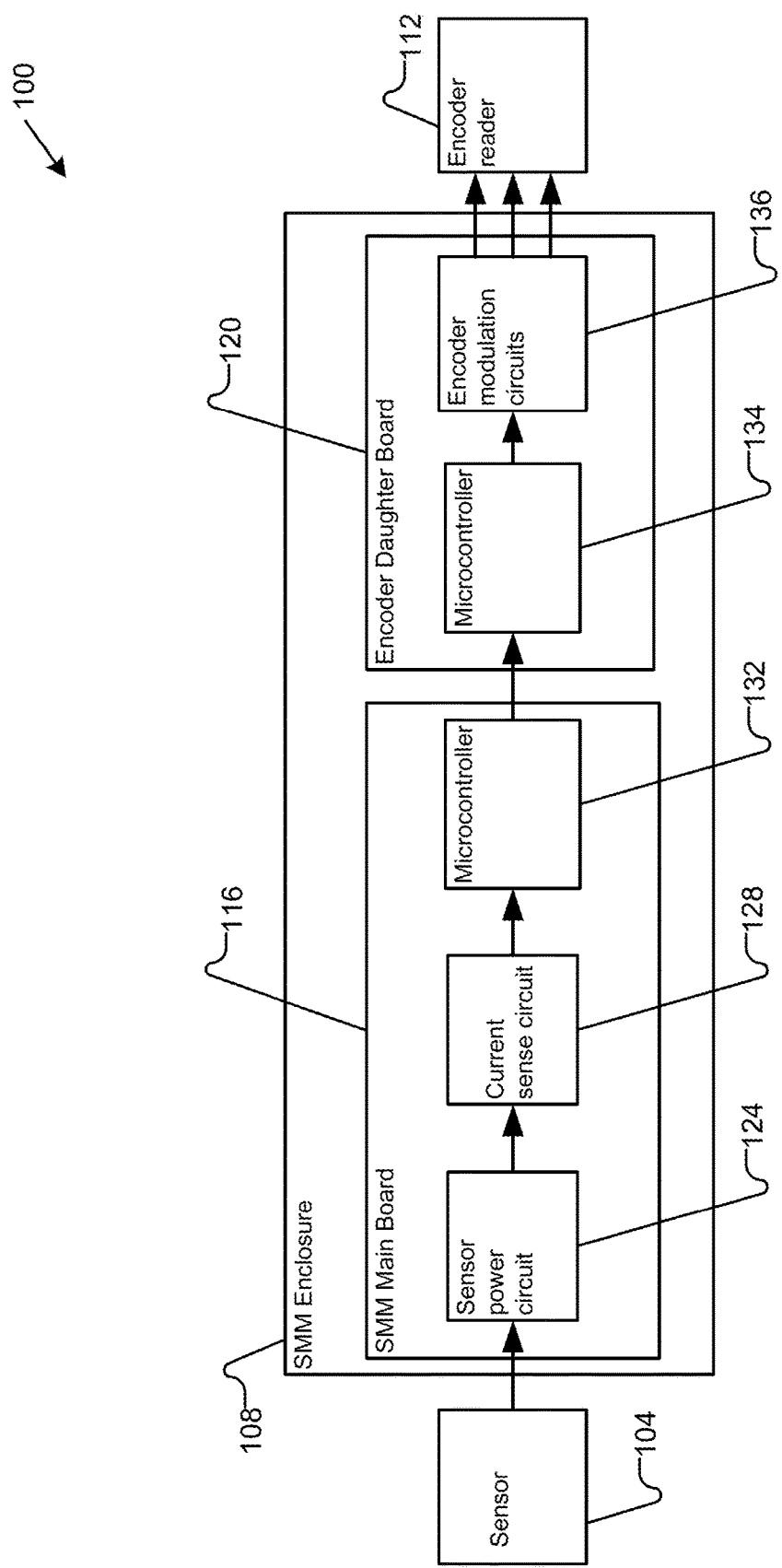
FIG. 1 is a schematic diagram of an embodiment in accordance with the present invention.

In FIG. 1, a schematic diagram for an exemplary signal converter system 100 is shown, in which an analog signal from a sensor 104 is converted in a meter enclosure 108 to an output that is read by an encoder reader 112. At a high level, enclosure 108 includes a circuit board and a microcontroller. For example, enclosure 108 may include a main board 116 and an encoder daughter board 120. Enclosure 108 may include a plurality of encoder daughter boards, with each daughter board configured to process data for and interface with encoder readers having different respective protocols. Alternatively, the formatting required for the different encoder output types may be accomplished on a single circuit board and microcontroller or other suitable technique.

Main board 116 includes a sensor power circuit 124, a current sense circuit 128, and a main board microcontroller 132. Sensor power circuit 124 is used to provide power to sensor 104 if sensor 104 requires power. Preferably, sensor power circuit 124 is switchable under program control. If meter enclosure 108 is required to power sensor 104, a power source is switched on. At least one extra conductor is typically required between enclosure 108 and sensor 104 if power is to be supplied.

Current sense circuit 128 receives an analog signal from sensor 104 and processes the signal before sending it to main board microcontroller 132. For example, if sensor 104 is a 4-20 mA flowmeter, the signal passes through a low impedance resistor before returning to sensor 104 via a digital ground connection. The output signal of the current sense resistor is then filtered using a low pass resistor-capacitor circuit and then passes through a unity gain operational-amplifier (op-amp) circuit. The output of the op-amp circuit is, in this example, a voltage that ranges from 0.4-2V, which is sent to main board microcontroller 132.

The output from current sense circuit 128 is fed to an analog-to-digital converter (ADC) input pin on main board microcontroller 132. Firmware periodically executes an ADC conversion and stores the result in a buffer. The period at which conversions are executed is configurable by a user.

Data stored in the buffer from the ADC conversions is then processed as applicable for the type of measurement data comprising the signal. For example, flow rate data may be integrated over time at a user configurable frequency to create a volumetric result (e.g., liters, cubic feet, etc.). The volumetric result is then placed into a formatted string for transmission to encoder daughter board 120 via a serial universal asynchronous receiver/transmitter (UART) link or other suitable mechanism. The formatting of the string is determined by the type of encoder reader system (e.g., Sensus, Neptune, Elster) that is to be connected to enclosure 108 to read the output as well as the connection type (e.g., 2-wire or 3-wire). The type of encoder to be used or interfaced with is configurable by the user and can be switched as necessary for different encoder types.

The appropriately formatted encoder string is then stored until an encoder reader initiates a read. In the example shown in FIG. 1, the formatted encoder string is sent to the selected encoder daughter board. Upon receipt of the formatted encoder string, firmware on a daughter board microcontroller 134 on encoder daughter board 120 stores the string in a buffer and waits for a read initiation to be sent by encoder reader 112 if an encoder reader is operably connected to enclosure 108. Once the read is initiated by connected reader 112, the daughter board firmware transmits the formatted encoder string to reader 112. The formatted encoder string is transmitted by daughter board 120 in compliance with the configured protocol, such as Sensus, Neptune, or Elster protocols. For this transmission, encoder reader 112 may power the link to daughter board 120 and provide a clock signal. Daughter board 120 would then time the data transmission using the provided clock signal, and may include encoder modulation circuits 136 that receive the clock signal from encoder reader 112 and modulate the signal sent to encoder reader 112.

Figure 2:
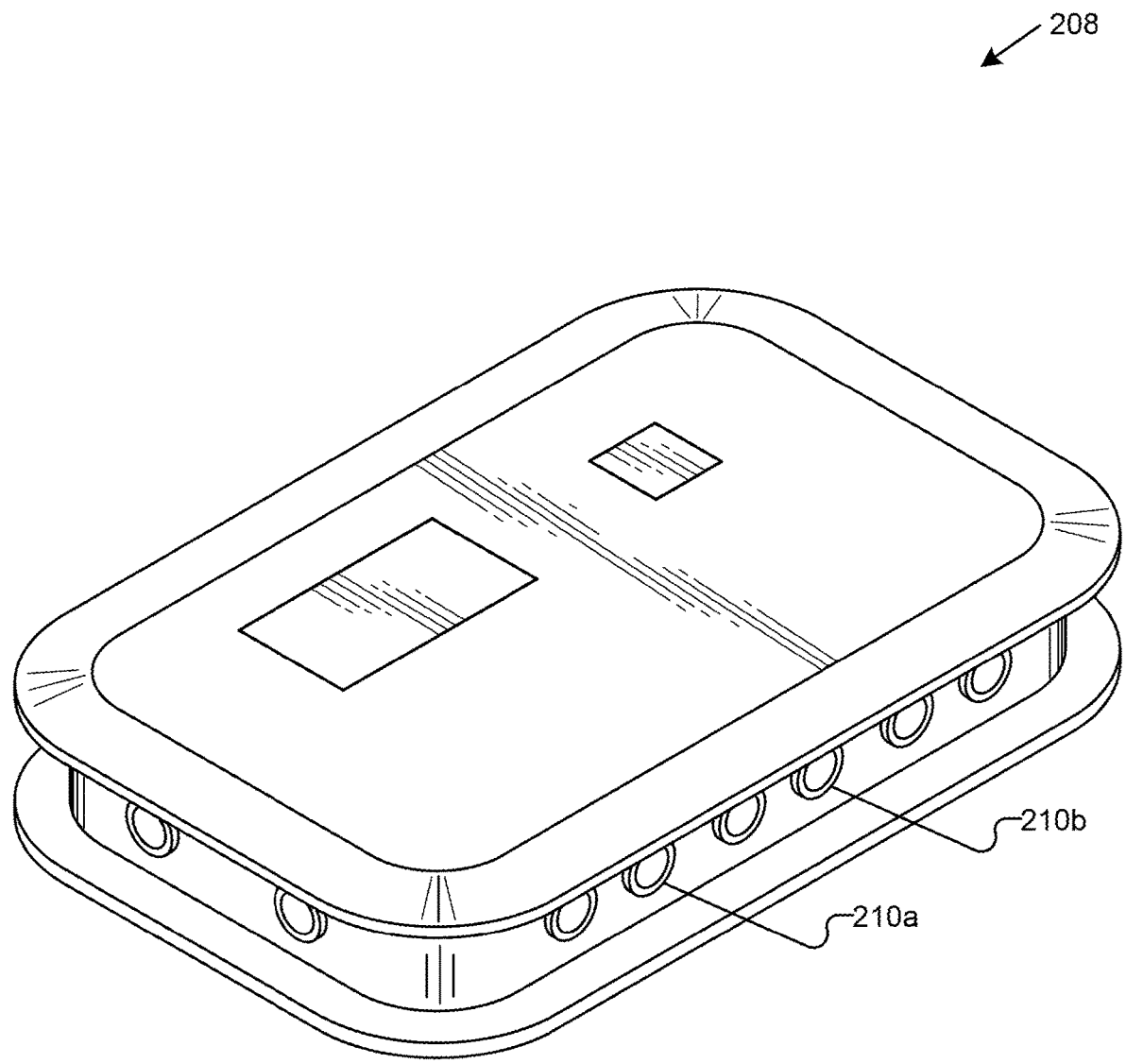
FIG. 2 is a perspective view of a signal converter in accordance with an embodiment of the present invention.
Figure 3:
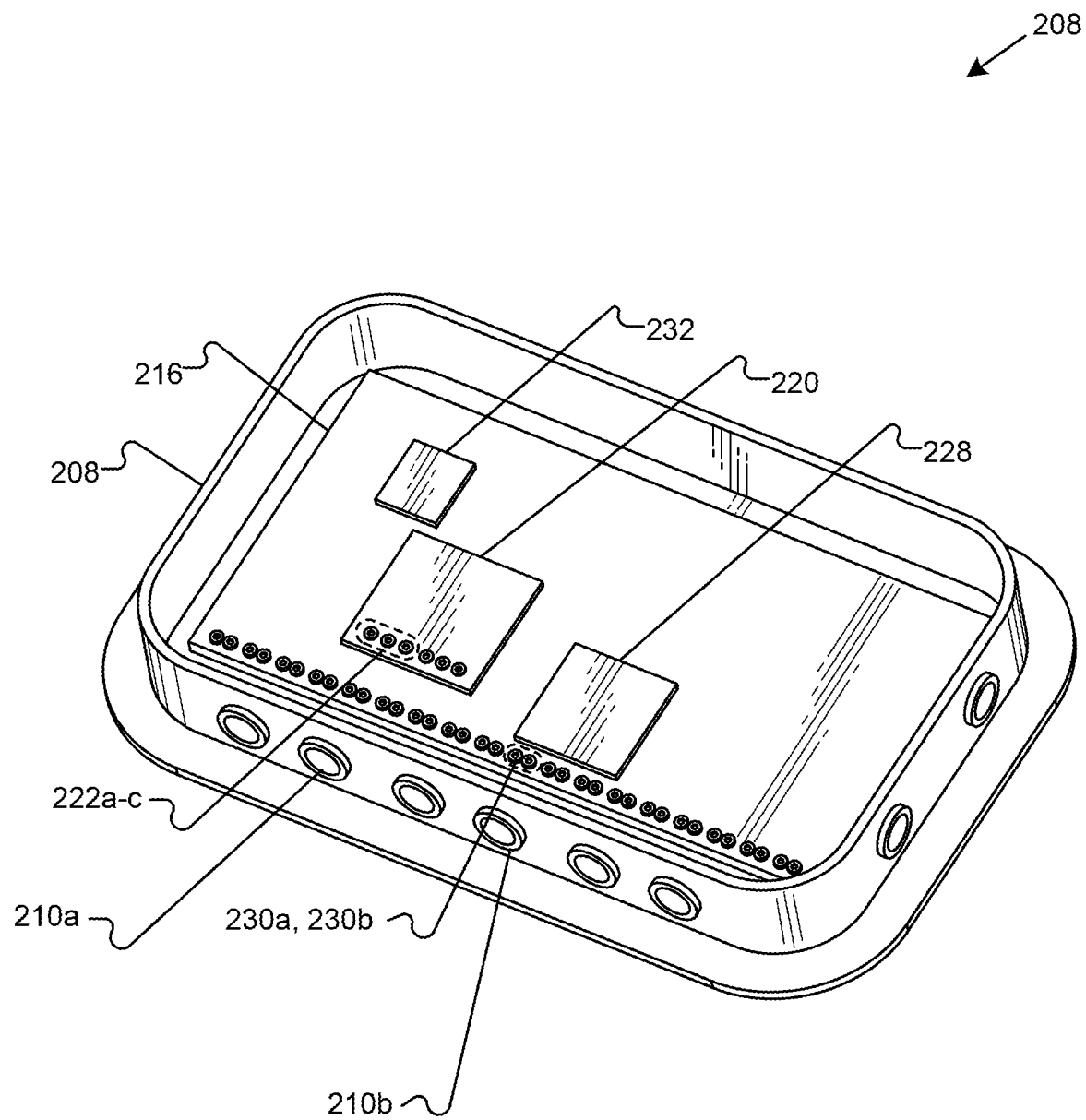
FIG. 3 is a view of the signal converter of FIG. 2 without a cover.
Figure 4:
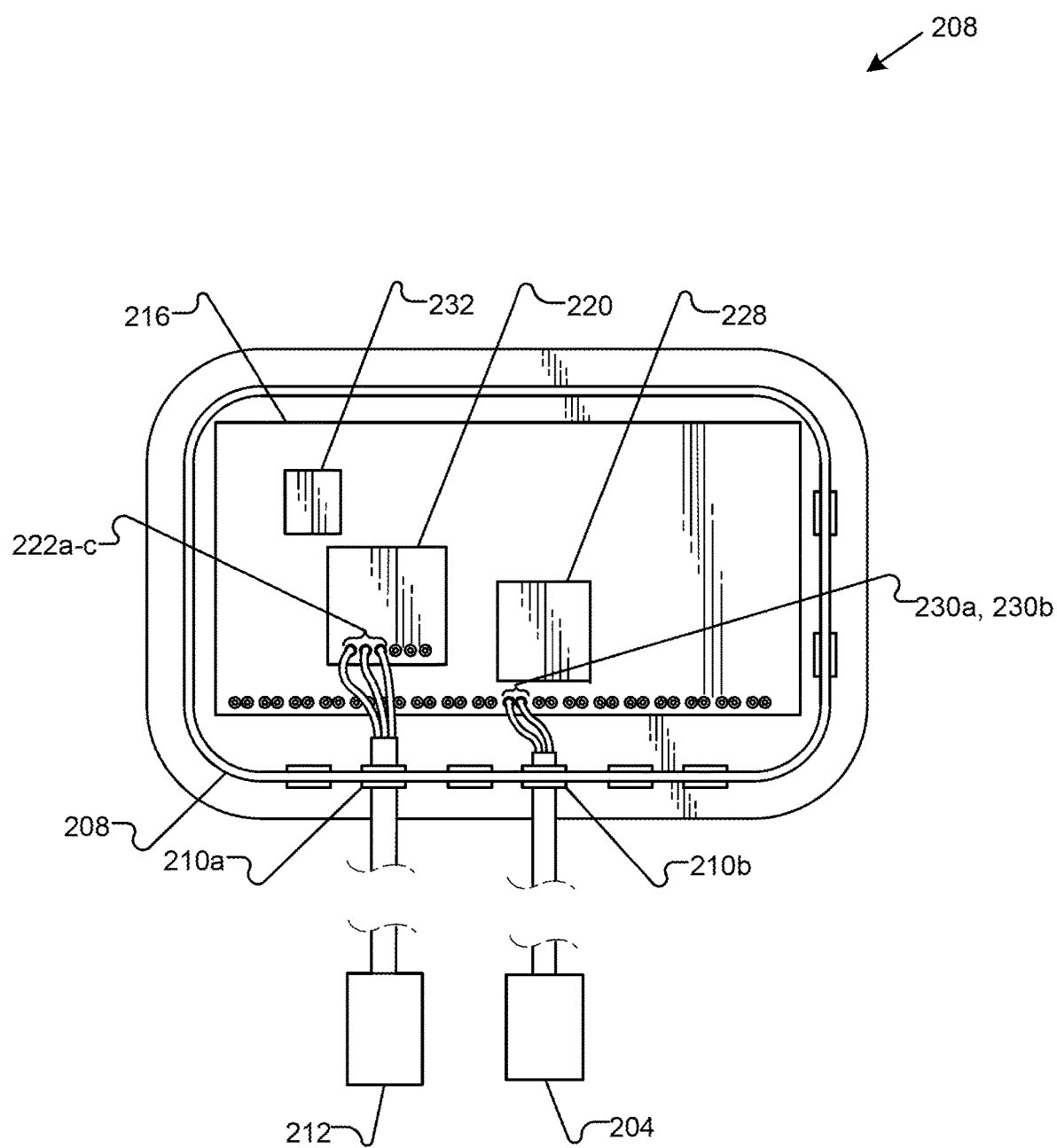
FIG. 4 shows the open signal converter of FIG. 3 connected to a sensor and a reader.

A signal converter of the present invention may be of any suitable size or shape, an example of which is shown in FIG. 2, which is a meter enclosure 208 that may include ports 210 (e.g., 210a, 210b) for allowing connections to a sensor 204 and encoder reader 212 (as shown in FIG. 4). In FIG. 3, enclosure 208 is shown with the cover removed. Meter enclosure 208 contains the hardware and firmware required to convert the received analog signal and to allow users to make selections (e.g., of the type of encoder reader protocol to be used), including, for example, a main board 216, an encoder daughter board 220, a current sense circuit 228, and a main board microcontroller 232. In addition, enclosure 208 includes encoder reader connections 222 (e.g., 222a-222c) and sensor connections 230 (e.g., 230a, 230b), which are preferably located near current sense circuit 228.

An exemplary current sense circuit receives an analog signal from a sensor, in this example a 4-20 mA flow rate input signal from a utility sewer flowmeter. That signal passes through a low impedance resistor before returning to the sensor via a digital ground connection. An output signal of the resistor is then filtered using a low pass resistor-capacitor (RC) circuit and then passes through a unity gain op-amp circuit. The output of op-amp circuit is a voltage that ranges from 0.4-2V, which is sent to the main board microcontroller.

Figure 5:
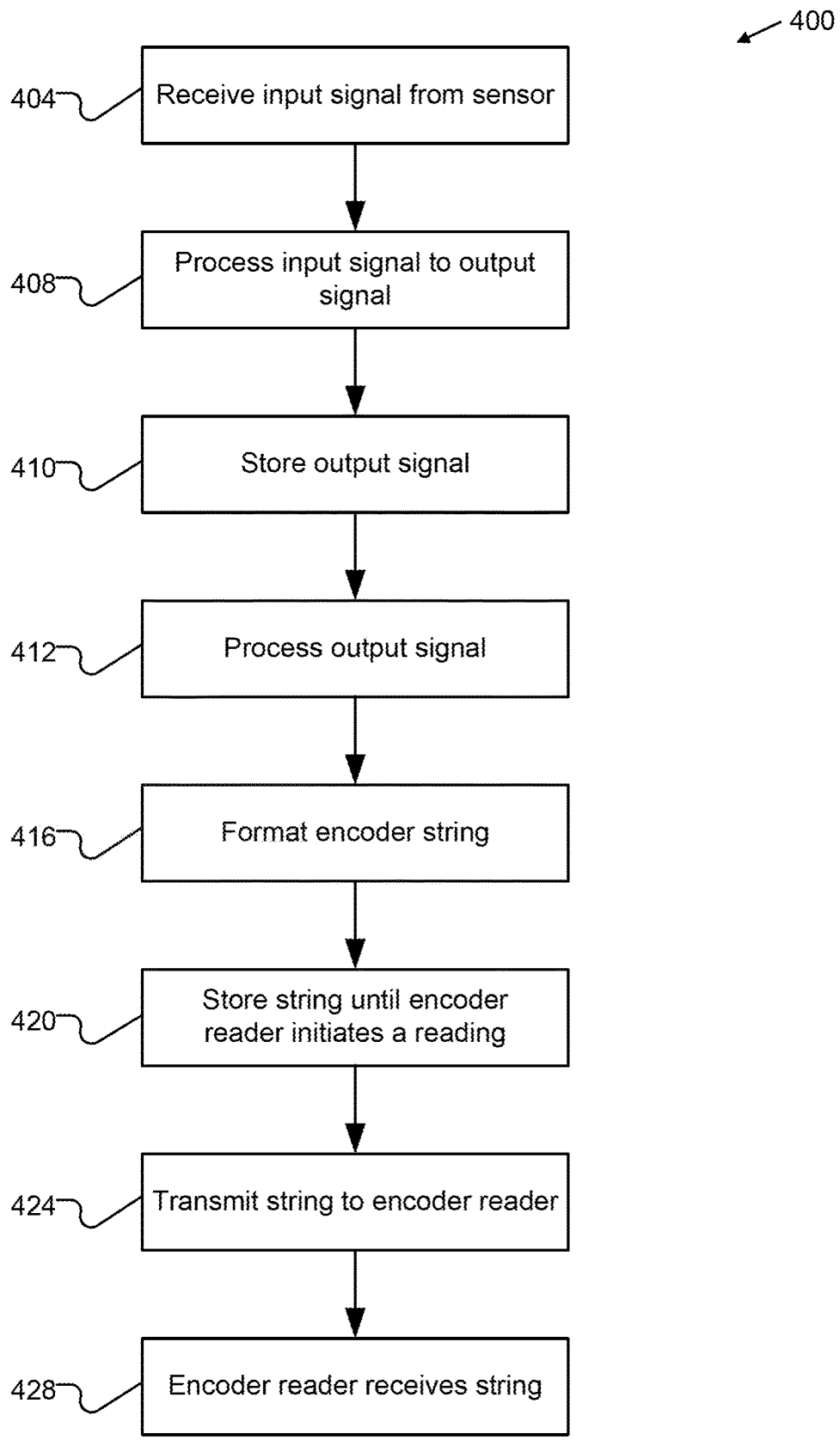
FIG. 5 is a process diagram outlining an exemplary analog to encoder signal conversion in accordance with an embodiment of the present invention.

An exemplary signal conversion process 400 is outlined in FIG. 5. At step 404, an input signal is received by a current sense circuit where it passes through a low impedance resistor before returning to the sensor via the digital ground connection. The output signal of the current sense resistor is then filtered using a low pass RC circuit and then passes through a unity gain op-amp circuit. The output of the op-amp circuit is a voltage that ranges from 0.4-2V, which is fed to an ADC at step 408. The digital signal is then stored in a buffer at step 410. At step 412, the stored data is processed as appropriate for the type of sensor, such as being integrated over time to generate a volumetric result or converted into a current reading such as a flow rate or pressure value. This result is then formatted at step 416 into a string suitable for the selected encoder reader protocol. This formatted encoder reader string is sent to the daughter board at step 420 where it is stored until a read initiation is received from an encoder reader. When a read initiation is received, the formatted string is transmitted to the reader at step 424. The encoder reader then receives the string at step 428 in an encoder format that matches the encoder protocol in use within that data collection system. These readings could represent a current, totalized, or any other suitable value pertinent for the commodity being monitored/measured.

Exemplary embodiments have been disclosed above and illustrated in the accompanying drawings. It will be understood by those skilled in the art that various changes, omissions, and additions may be made to that which is specifically disclosed herein without departing from the spirit and scope of the present invention.

What is claimed is:

1. A sensor to encoder signal converter comprising:
   a current sense circuit configured to receive a signal from a liquid parameter sensor,
   wherein the signal is representative of a sensed parameter of a liquid;
   a microcontroller configured to receive the signal and including instructions for:
      transforming the signal into a sensor reading value,
      creating a string representing the value, wherein the string is formatted for a selected encoder reader protocol,
      storing the string, and
      transmitting the string to an encoder reader when an initialization signal is received from the encoder reader; and
   an encoder modulation circuit selectively configured to interface with the encoder reader.

2. A signal converter according to claim 1, wherein the signal is a digital signal.

3. A signal converter according to claim 1, further including a plurality of encoder reader connections and a plurality of sensor connections.

4. A signal converter according to claim 1, further including a power source designed to power the sensor, wherein the power source is switchable by a user and wherein the liquid parameter sensor is a flowmeter, a fluid pressure sensor, or a chemical content sensor.

5. A signal converter according to claim 1, wherein the signal is an analog signal, and the current sense circuit converts the analog signal into a digital signal.

6. A signal converter according to claim 5, wherein the current sense circuit includes a low impedance resistor, a low pass RC circuit, and an operational amplifier.

7. A signal converter according to claim 1, further including a plurality of daughter microcontrollers, wherein one of the plurality of daughter microcontrollers is selected based on the selected encoder reader protocol and stores the string and receives the initialization signal from the encoder reader.

8. A method for converting an input signal into an encoder output comprising:
   selecting an encoder interface protocol;
   receiving a signal from a sensor, the signal representing a parameter of a commodity measured by the sensor;
   transforming the signal into a sensor reading value;
   generating a string representing the value, wherein the string is formatted for the selected encoder reader protocol;
   receiving an initialization signal from an encoder reader; and
   transmitting the string to the encoder reader.

9. The method of converting an input signal according to claim 8, wherein the signal is an analog signal and further including passing the analog signal through a low impedance resistor.

10. The method of converting an input signal according to claim 9, further including returning a portion of the signal to the sensor via a digital ground connection after passing the analog signal through a low impedance resistor.

11. The method of converting an input signal according to claim 10, further including filtering the signal with a low pass RC circuit after the signal passes through the resistor.

12. The method of converting an input signal according to claim 11, further including passing the signal through an operational amplifier.

13. The method of converting an input signal according to claim 8, wherein the sensor reading value is a volume.

14. The method of converting an input signal according to claim 8, further including powering the sensor.

15. A system for converting a signal to an encoder output comprising:
   a sensor, the sensor producing a signal representing a parameter of a commodity;
   an encoder reader; and
   a converter enclosure, the enclosure including:
      a microcontroller configured to receive the signal and including instructions for:
         transforming the signal into a sensor reading value,
         generating a string representing the value, wherein the string is formatted for a selected encoder reader protocol,
         storing the string, and
         transmitting the string to an encoder reader when an initialization signal is received from the encoder reader; and
      an encoder modulation circuit configured to interface between the encoder reader and the microcontroller.

16. A system according to claim 15, wherein the enclosure further includes a plurality of encoder reader connections and a plurality of sensor connections.

17. A system according to claim 15, wherein the enclosure further includes a power source designed to power the sensor, wherein the power source is switchable by a user.

18. A system according to claim 15, wherein the sensor is a flowmeter with a 4-20 mA output.

19. A system according to claim 15, wherein the sensor is a pressure sensor.

20. A system according to claim 15, wherein the signal is an analog signal, and the enclosure further includes a current sense circuit that converts the analog signal into a digital signal.

\* \* \* \* \*